(12) United States Patent
Schimperna et al.

(10) Patent No.: US 9,150,696 B2
(45) Date of Patent: Oct. 6, 2015

(54) PROCESS FOR THE PREPARATION OF POLYMERS CONTAINING BENZOHETERO [1,3] DIAZOLE UNITS

(75) Inventors: Giuliana Schimperna, Novara (IT); Gabriele Bianchi, Novara (IT)

(73) Assignee: ENI S.P.A., Rome (IT)

( * ) Notice: Subject to any disclaimer, the term of this patent is extended or adjusted under 35 U.S.C. 154(b) by 0 days.

(21) Appl. No.: 14/237,528

(22) PCT Filed: Aug. 1, 2012

(86) PCT No.: PCT/IB2012/053925
§ 371 (c)(1),
(2), (4) Date: Apr. 7, 2014

(87) PCT Pub. No.: WO2013/021314
PCT Pub. Date: Feb. 14, 2013

(65) Prior Publication Data
US 2014/0235818 A1    Aug. 21, 2014

(30) Foreign Application Priority Data
Aug. 8, 2011 (IT) ............................. MI2011A1517

(51) Int. Cl.
| | | |
|---|---|---|
| *C08G 75/00* | (2006.01) | |
| *C08G 75/32* | (2006.01) | |
| *H01B 1/00* | (2006.01) | |
| *H01L 51/00* | (2006.01) | |
| *C08G 73/06* | (2006.01) | |
| *C08G 61/12* | (2006.01) | |

(52) U.S. Cl.
CPC ............. *C08G 75/32* (2013.01); *C08G 61/123* (2013.01); *C08G 61/126* (2013.01); *C08G 73/0611* (2013.01); *H01B 1/00* (2013.01); *H01L 51/00* (2013.01); *H01L 51/0036* (2013.01); *C08G 2261/1412* (2013.01); *C08G 2261/3223* (2013.01); *C08G 2261/3241* (2013.01); *C08G 2261/3246* (2013.01); *C08G 2261/92* (2013.01); *Y02E 10/549* (2013.01)

(58) Field of Classification Search
CPC ................... C08G 2261/12; C08G 2261/3246; C08G 2261/3245

USPC ............. 428/690; 564/426; 549/41, 456, 160, 549/349, 331; 528/380, 264
See application file for complete search history.

(56) References Cited

FOREIGN PATENT DOCUMENTS

CN            102153732        *   8/2011    ............. C08G 61/12

OTHER PUBLICATIONS

Piyush, Anant, et al., "Synthesis and Characterization of donor-acceptor type 4,4'-bis(2,1,3-benzothiadiazole)-based copolymers", Polymer, vol. 52, No. 20, Sep. 1, 2011, pp. 4442-4450.
Cai, T., et al., "Low bandgap polymers synthesized by FeCl3 oxidative polymerization", Solar Energy Materials and Solar Cells, Elsevier Science Publishers, Amsterdam, NL, vol. 94, No. 7, Jul. 1, 2010, pp. 1275-1281.
Wei, Yue, et al., "Poly(oligothiophene-alt-benzothiadiazole)s: Tuning the Structures of Oligothiophene Units toward High-Mobility "Black" Conjugated Polymers", Macromolecules, vol. 42, No. 17, Sep. 8, 2009, pp. 6510-6518.
Zhang, et al., "Calculation of band gap in long alkyl-substituted heterocyclic-thiophene-conjugated polymers with electron donor-acceptor fragment", Solar Energy Materials and Solar Cells, Elsevier Science Publishers, Amsterdam, NL, vol. 92, No. 5, Feb. 20, 2008, pp. 581-587.
Kai-Fang, Cheng, et al., "Synthesis properties, and field effect transistor characteristics of new thiophene-[1,2,5] thiadiazolo [3,4-g] quinoxa lin-thiophene-based conjugated polymers", Journal of Polymer Science Part A: Polymer Chemistry, vol. 46, No. 18, Sep. 15, 2008, pp. 6305-6316.
Ashraf, A. El-Shehawy, et al., "Alternating Copolymers Based on 2,1,3-Benzothiadiazole and Hexylthiophene: Positioning Effect of Hexyl Chains on the Photophysical and Electrochemical Properties", European Journal of Organic Chemistry, Jul. 5, 2011.

* cited by examiner

*Primary Examiner* — Shane Fang
(74) *Attorney, Agent, or Firm* — Tarolli, Sundheim, Covell & Tummino LLP

(57) ABSTRACT

Process for the preparation of a polymer containing benzohetero[1,3]diazole. units which comprises reacting at least one disubstituted benzohetero[1,3]diazole compound with at least one heteroaryl compound. Said polymer can be advantageously used in the construction of photovoltaic devices such as, for example, photovoltaic cells, photovoltaic modules, solar cells, solar modules, on both a rigid and flexible support. Furthermore, said polymer can be advantageously used in the construction of Organic Thin Film Transistors (OTFTs), or of Organic Field Effect Transistors (OFETs).

22 Claims, No Drawings

PROCESS FOR THE PREPARATION OF POLYMERS CONTAINING BENZOHETERO [1,3] DIAZOLE UNITS

The present invention relates to a process for the preparation of a polymer containing benzohetero[1,3]diazole units.

More specifically, the present invention relates to a process for the preparation of a polymer containing benzohetero[1,3] diazole units which comprises reacting at least one disubstituted benzohetero[1,3]diazole compound with at least one heteroaryl compound.

Said polymer can be advantageously used in the construction of photovoltaic devices such as, for example, photovoltaic cells, photovoltaic modules, solar cells, solar modules, on both a rigid and flexible support. Furthermore, said polymer can be advantageously used in the construction of Organic Thin Film Transistors (OTFTs), or of Organic Field Effect Transistors (OFETs).

The exploitation of solar energy by means of the photovoltaic technology is considered one of the best ways for responding to the increasing energy demand of our planet.

Photovoltaic devices are capable of converting the energy of a luminous radiation into electric energy. At present, most photovoltaic devices which can be used for practical applications exploit the physico-chemical properties of photoactive materials of the inorganic type, in particular high-purity crystalline silicon. As a result of the high production costs of silicon, scientific research, however, has been orienting its efforts towards the development of alternative organic materials having a polymeric structure (the so-called "polymer photovoltaic cells"). Unlike high-purity crystalline silicon, in fact, organic polymers are characterized by a relative synthesis facility, a low production cost, a reduced weight of the relative photovoltaic device.

The most widely-used polymer photovoltaic cells are those with an architecture known as "bulk heterojunction", having a photoactive layer comprising an electron-donor compound and an electron-acceptor compound which form a mixture in which the two phases consisting of said electron-donor compound and of said electron-acceptor compound form a dispersion on a nanometric level with an extremely high contact area.

Yu et al., for example, in: "Polymer Photovoltaic Cells: Enhanced Efficiencies via a Network of Internal Donor-Acceptor Heterojunction", Science (1995), Vol. 270, pages 1789-1791, describe polymer photovoltaic cells of the type reported above in which the photoactive layer comprises a mixture of an electron-donor compound, in particular a conjugated polymer, more specifically poly[2-methoxy-5-(2'-ethylhexyloxy)-1,4-phenylenevinylene] (MEH-PPV) and of an electron-acceptor compound, in particular PC61BM (6,6 phenyl-C61-butyric acid methyl ester).

Polymer photovoltaic cells of the type described above can currently reach conversion efficiencies of solar radiation into electric energy ranging, on an average, from 1% to 6%: the maximum conversion efficiency obtained has been 8.3%.

The basic conversion process of light into electric current in a polymer photovoltaic cell takes place through the following steps:
1. absorption of a photon on the part of the electron-donor compound with the formation of an exciton, i.e. a pair of "electron-electronic gap (or hole)" charge transporters;
2. diffusion of the exciton in a region of the electron-donor compound as far as the interface with the electron-acceptor compound;
3. dissociation of the exciton in the two charge transporters: electron (−) in the acceptor phase (i.e. in the electron-acceptor compound) and electronic gap [(or hole) (+)] in the donor phase (i.e. in the electron-donor compound);
4. transporting of the charges thus formed to the cathode (electron, through the electron-acceptor compound) and to the anode [electronic gap (or hole), through the electron-donor compound], with the generation of an electric current in the circuit of the organic photovoltaic cell.

The photo-absorption process with the formation of the exciton and the subsequent yielding of the electron to the electron-acceptor compound leads to the excitation of an electron from the HOMO (Highest Occupied Molecular Orbital) to the LUMO (Lowest Unoccupied Molecular Orbital) of the electron-donor compound and, subsequently, the passage from this to the LUMO of the electron-acceptor compound.

As the efficiency of a polymer photovoltaic cell depends on the number of free electrons which are generated by dissociation of the excitons which in turn can be directly correlated with the number of photons absorbed, one of the structural characteristics of the electron-donor compounds which mostly influences said efficiency is the difference in energy existing between the HOMO and LUMO orbitals of the electron-donor compound, i.e. the so-called band-gap. The maximum wave-length value at which the electron-donor compound is capable of collecting and effectively converting photons into electric energy, i.e. the so-called "photon harvesting" or "light-harvesting" process, depends on this difference. In order to obtain acceptable electric currents, the band-gap between HOMO and LUMO must not be excessively high, but at the same time must not be excessively low. An excessively low band-gap would in fact correspond to an excessively high HOMO which would jeopardize the voltage obtained at the electrodes of the device (this voltage can be in fact correlated to the difference between HOMO and LUMO of the electron-donor compound).

In the simplest way of operating, the polymer photovoltaic cells having an architecture known as "bulk heterojunction" described above, are produced by introducing a thin layer (about 100 nanometers) of a mixture of the electron-acceptor compound and of the electron-donor compound (architecture known as "bulk heterojunction"), between two electrodes, normally consisting of indium-tin oxide (ITO) (anode) and aluminium (Al) (cathode). In order to produce a layer of this type, a solution of the two components is generally prepared and a photoactive film is subsequently created on the anode [indium-tin oxide (ITO) starting from this solution, resorting to suitable deposition techniques such as, for example, "spin-coating", "spray-coating" "ink-jet printing", and the like. At the end, the counter-electrode [i.e. the aluminium cathode. (Al)] is deposited on the dried film. Optionally, other additional layers capable of exerting specific functions of an electric, optical or mechanical nature, can be introduced between the electrodes and the photovoltaic film.

In order to facilitate the electronic gaps (or holes) in reaching the anode [indium-tin oxide (ITO)] and at the same time to block the transport of electrons, thus allowing an improved collection of the charges on the part of the electrode and inhibiting recombination phenomena, before creating the photoactive film starting from the mixture of acceptor compound and of donor compound as described above, a film is deposited, starting from an aqueous suspension of PEDOT: PSS [poly(3,4-ethylenedioxythiophene)-polystyrene sulfonate], resorting to suitable deposition techniques such as, for example, "spin-coating", "spray-coating" "ink-jet printing", and the like. At the end, the counter-electrode [i.e. the aluminium cathode (Al)] is deposited on the dried film.

The electron-donor compound which is most commonly used in the construction of organic photovoltaic cells is regioregular poly(3-hexylthiophene) (P3HT). This polymer has optimal electronic and optical characteristics (good HOMO and LUMO orbital values, good adsorption coefficient), a good solubility in the solvents used in the construction of photovoltaic cells and a reasonable mobility of the electronic holes.

Other examples of polymers which can be advantageously used as electron-donor compounds are: the polymer PCDTBT {poly[N-9''-heptadecanyl-2,7-carbazole-alt-5,5-(4',7'-di-2-thienyl-2',1',3'-benzothiadiazole]}, the polymer PCPDTBT {poly[2,6-(4,4-bis-(2-ethylhexyl)-4H-cyclopenta[2,1-b;3,4-b']-dithio-phene)-alt-4,7-(2,1,3-benzothiadiazole)]}.

As is known, conjugated polymers consist of alternating σ and π bonds and have a σ bond skeleton due to the superimposition of sp$_2$ orbitals. Furthermore, the p$_z$ orbitals of a carbon atom are superimposed with the p$_z$ orbitals of the adjacent atoms allowing the formation of a system of π bonds: the electrons of the π bonds are therefore delocalized on the whole molecule.

The above conjugated polymers have electronic properties similar to those of inorganic semiconductors: said electronic properties derive from the delocalization of the π bonds.

The electron-donor conjugated polymers used in polymer photovoltaic cells must be capable of reaching good conversion efficiencies of solar radiation to electric energy. In this respect, it should be remembered that, in order to be advantageously used in polymer photovoltaic cells, an electron-donor conjugated polymer must have:
- energy levels compatible with those of the electron-acceptor polymer (e.g., a derivative of fullerene);
- a high mobility of the electronic gaps;
- a certain crystallinity degree;
- a good solubility in organic solvents;
- a good compatibility with the organic acceptor polymer in order to confer an appropriate morphology to the active phase;
- a high photo-stability;
- a low band-gap value (≤2 eV).

In particular, as far as the band-gap value is concerned, it should be remembered that the flow of photons of solar radiation which reaches the surface of the Earth is maximum for energy values of around 1.8 eV (corresponding to radiations having a wavelength of about 700 nm). Due to the high band-gap values generally higher than 2 eV, which characterize the above electron-donor compounds, the light harvesting or photon harvesting process within this spectral field is not very efficient and only a fraction of the overall solar energy, generally that ranging from 350 nm to 650 nm, is converted into electric energy. Among the polymers most widely-used as donor compounds, for example, the above-mentioned regioregular polymer poly(3-hexylthiophene (P3HT) has a band-gap equal to 1.9 eV.

In order to improve the yield of the light harvesting or photon harvesting process and, consequently, the efficiency of the organic photovoltaic devices, it is therefore fundamental to find new electron-donor polymers capable of capturing and of converting solar radiations having a lower energy, i.e. electron-donor polymers characterized by lower band-gap values than those of polymers typically used as electron-donor compounds.

A great effort has been made in the art for finding electron-donor polymers having a low band-gap value.

One of the most widely-used strategies for obtaining electron-donor polymers having a low band-gap, for example, is the synthesis of alternating conjugated copolymers comprising electron-rich units (donor) and electron-poor units (acceptor). A synthesis of this kind is described, for example, by Chen et al. in: "Development of Novel Conjugated Donor Polymers for High-Efficiency Bulk-Heterojunction Photovoltaic Devices", Account of Chemical Research (2009), Vol. 42(11), pages 1709-1718.

One of the monomeric units most widely-used as electron-poor unit (acceptor) for obtaining alternating conjugated polymers comprising electron-rich units (donor) and electron-poor units (acceptor) having a low band-gap, is 2,1,3-benzothiadiazole having formula (1):

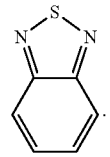

(1)

Said alternating conjugated polymers are also characterized by a high electronic mobility and by a wide absorption spectrum. Examples of electron-rich units (donor), comprising thiophene and its derivatives, used in the above alternating conjugated polymers are indicated hereunder in Figure 1:

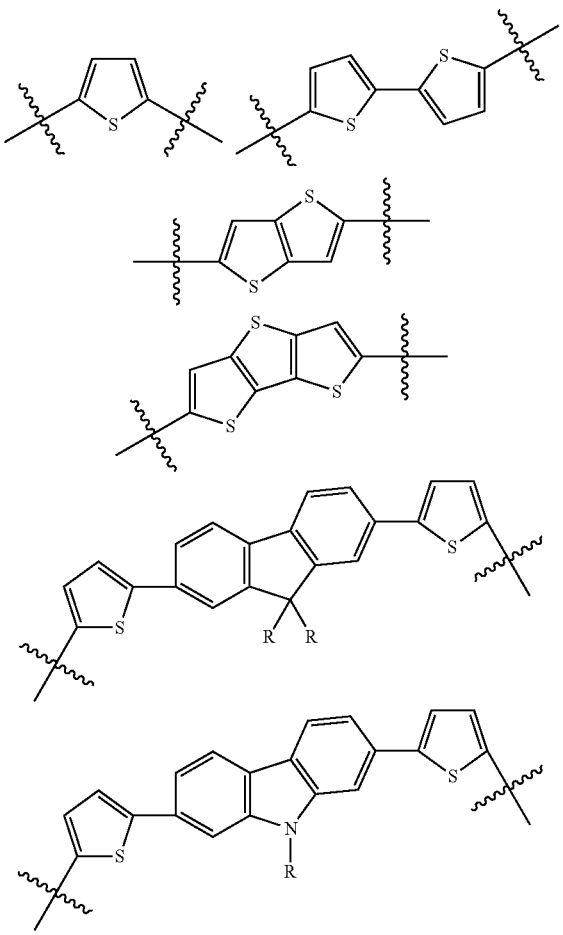

FIG. 1

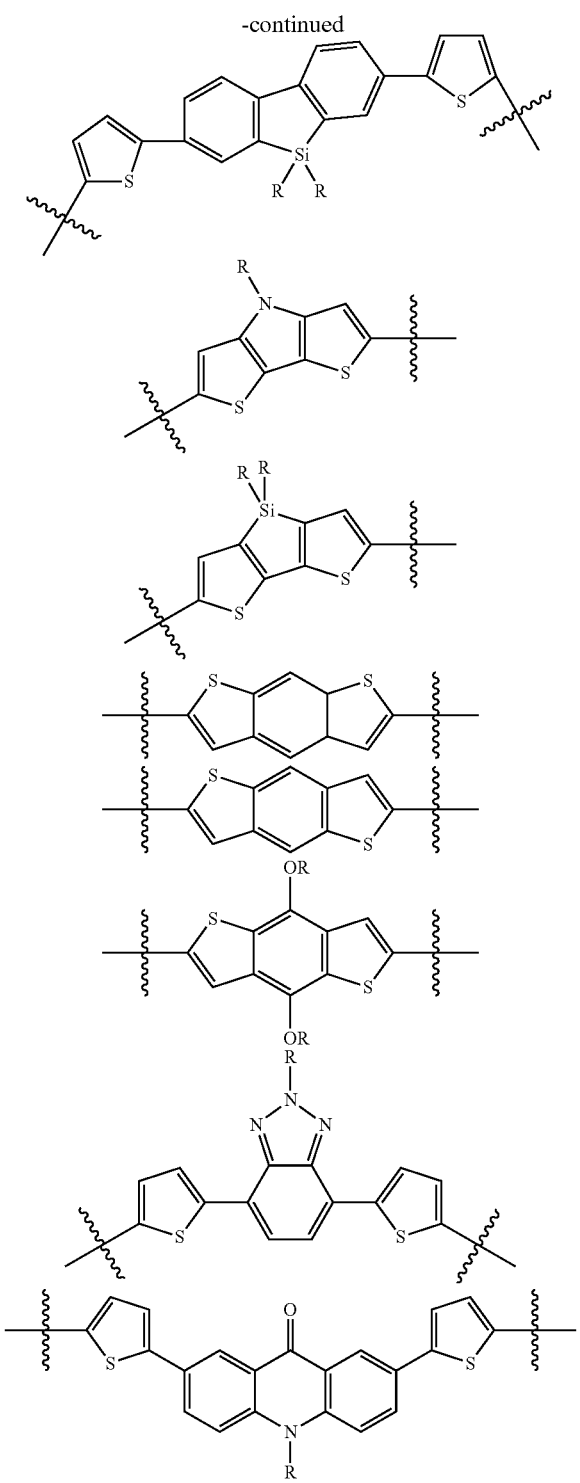

wherein R generally represents a linear or branched $C_1$-$C_{20}$ alkyl group.

Processes for the synthesis of the above alternating conjugated polymers are known in the art.

Cheng et al. in: "Synthesis of Conjugated Polymers for Organic Solar Cell Applications", Chemical Review (2009), Vol. 109, pages 5868-5923, for example, describe various processes for the preparation of conjugated polymers. Said processes are carried out in the presence of metallic catalysts, in particular catalysts containing palladium, and/or in the presence of compounds containing metals such as, for example, palladium, nickel, zinc, magnesium, tin, lithium, and the like.

Said processes, however, can have various drawbacks due to the effects of the metallic residues which can remain in the conjugated polymers thus obtained. It is known, in fact, that the properties of said alternating conjugated polymers, in particular the electrical properties, can be negatively influenced by the presence of metallic residues as described, for example, by:

Sonar et al. in "A study on the effects metal residues in poly(9,9-dioctylfluorene) have on field-effect transistor device characteristics", Synthetic Metal (2007), Vol. 157, pages 872-875;

Krebs et al. in "Influence of Residual Catalyst on the Properties of Conjugated Polyphenylenevinylene Materials: Palladium Nanoparticles and Poor. Electrical Performance", Chemical Material (2004), Vol. 16, pages 1313-1318;

Björklund et al. in "The effects of metal impurities in poly[2, 5-bis(3-decylthiophen-2-yl)-thienol[2,3-b]-thiophene] on field-effect transistor properties", Organic Electronics (2009), Vol. 10, pages 215-221.

Processes are also known for the preparation of said alternating conjugated polymers capable of reducing the quantity of metallic catalysts and/or of compounds containing metals used therein.

Alternating conjugated polymers having formula (Ib), for example, can be prepared by means of a process which comprises reacting, in the presence of catalysts containing palladium, 4,7-dibromo-2,1,3-benzothiadiazole having formula (Ia) with a di-tri-alkyl-stannyl arene having formula (2) (Stille reaction indicated hereunder in Scheme 1), or with a heteroarene (Stille reaction not indicated hereunder in Scheme 1), or with a di-arylboronic acid having formula (3) (Suzuki reaction indicated hereunder in Scheme 2) or with a di-heteroarylboronic acid or their corresponding ester derivative (Suzuki reaction not indicated hereunder in Scheme 2):

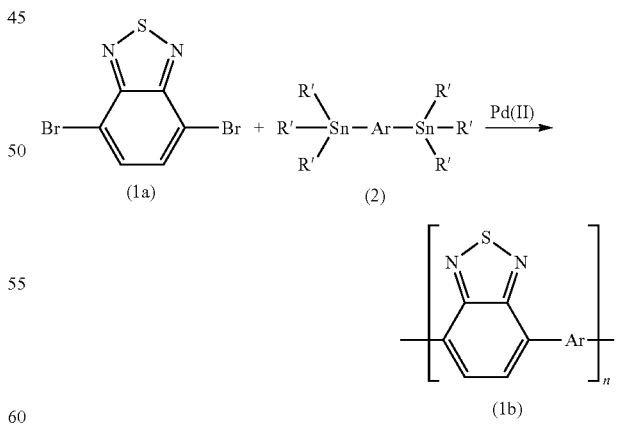

wherein Ar represents the electron-rich units (donor) indicated above in Figure 1, and the substituents R', the same or different from each other, represent a linear or branched $C_1$-$C_{20}$ alkyl group;

Scheme 2

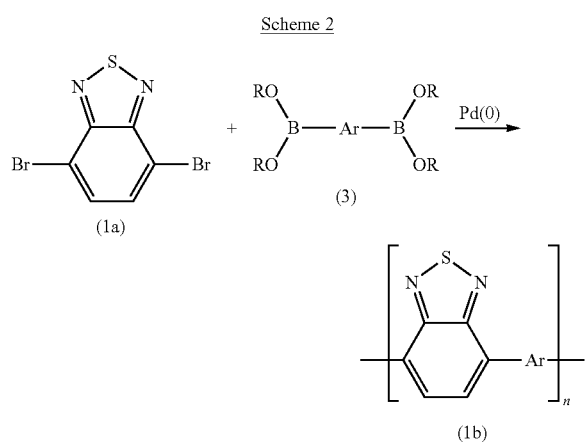

wherein Ar has the meanings described above and the substituents R, the same or different from each other, represent a hydrogen atom, or a linear or branched $C_1$-$C_{20}$ alkyl group, or the OR groups together with the other atoms to which they are bound can form a heterocyclic ring having the following formula (4):

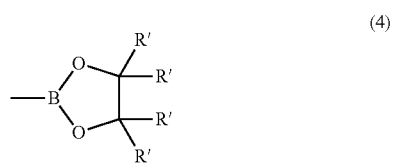

wherein the substituents R', the same or different from each other, represent a hydrogen atom, or a linear or branched $C_1$-$C_{20}$ alkyl group, and B is boron.

The above Stille and Suzuki reactions are generally catalyzed by bis(triphenylphosphine)palladium(II) chloride [PdCl$_2$(PPh$_3$)$_2$], as such or prepared in situ starting from palladium chloride (PdCl$_2$) and triphenylphosphine; or palladium(0)-tetrakistriphenyl-phosphine [Pd(PPh$_3$)$_3$], or palladium(II) acetate [Pd(OAc)$_2$], or other phosphines such as, for example, tri-ortho-tolyl phosphine or tris-para-tolyl phosphine.

Stille and Suzuki reactions can be carried out in solvents selected, for example, from: ethers (for example, 1,2-dimethoxyethane, 1,4-dioxane, tetrahydrofuran); hydrocarbons (toluene, xylene); dipolar aprotic solvents (N,N-dimethylformamide, N-methylpyrrolidone, dimethylsulfoxide). The reaction temperatures generally range from 80° C. to 160° C.

In the case of Suzuki reactions, a saturated aqueous solution of sodium bicarbonate or of potassium bicarbonate, or a saturated aqueous solution of sodium or of potassium carbonate, must be added.

At the end of the above reactions, the product obtained, i.e. the polymer, is generally precipitated in alcohol such as, for example, methanol, the precipitate obtained is washed with a solvent such as, for example, heptane or ethyl ether, obtaining a residue which is re-dissolved in a solvent such as, for example, chloroform or chlorobenzene, and re-precipitated in an alcohol such as, for example, methanol.

Tri-alkyl-stannyl arenes are generally prepared starting from the corresponding halogen arenes (Ar'—X) by reaction with an alkyl lithium such as, for example, n-butyl lithium (n-BuLi), to give the corresponding aryl lithium (Ar'—Li), which is reacted in situ with a tri-alkyl-stannyl chloride [ClSn(R")$_3$] to give the corresponding tri-alkyl-stannyl arene [Ar'—Sn(R")$_3$] as indicated hereunder in Scheme 3:

Scheme 3

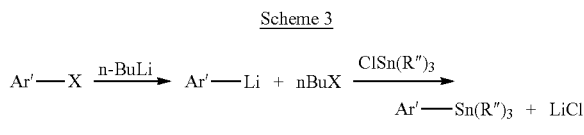

wherein Ar' represents an arene or a heteroarene, X represents a halogen atom, preferably bromine, and the substituents R", the same or different from each other, represent a linear or branched $C_1$-$C_{20}$ alkyl group.

If 2-tri-alkyl-stannyl thiophene (Ar=thiophene) is to be prepared, it is not necessary to use the corresponding halogen arene, i.e. 2-halogen thiophene, as the thiophene having formula (5) can be reacted directly with an alkyl lithium such as, for example, n-butyl lithium (n-BuLi), or with a lithium di-alkyl amide (reaction not indicated in Scheme 4), obtaining a thienyl-lithium having formula (6) which can be reacted in situ with a tri-alkyl-stannyl chloride [ClSn(R")$_3$] to give the corresponding tri-alkyl-stannyl thiophene having formula (7) as indicated hereunder in Scheme 4:

Scheme 4

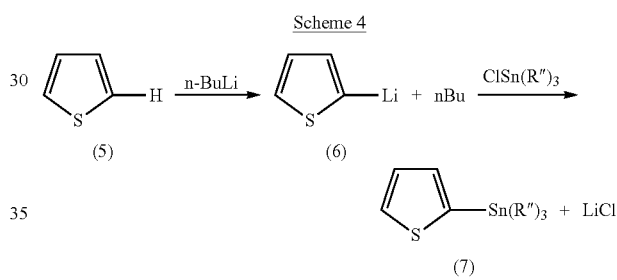

wherein the substituents R", the same or different from each other, represent a linear or branched $C_1$-$C_{20}$ alkyl group.

Analogously, di(tri-alkyl stannyl arenes) (10) can be prepared by reacting a di-halogen arene having formula (8) with an alkyl lithium such as, for example, n-butyl lithium (n-BuLi), obtaining a di-lithium-arene having formula (9), which can be reacted in situ with a tri-alkyl-stannyl chloride [ClSn(R")$_3$] as indicated hereunder in Scheme 5; or di-2,5-tri-alkylstannylthiophenes having formula (13) can be prepared, by reacting a bis-thiophene-bis-thienyl derivative having formula (11) with an alkyl lithium such as, for example, n-butyl lithium (n-BuLi), obtaining a di-lithium-bis-thienyl derivative having formula (12) which can be reacted in situ with a tri-alkyl-stannyl chloride [ClSn(R")$_3$] as indicated hereunder in Scheme 6:

Scheme 5

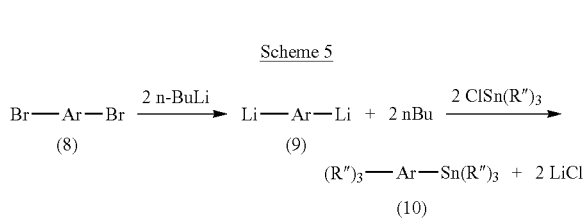

wherein Ar' represents an arene or a heteroarene, and the substituents R", the same or different from each other, represent a linear or branched $C_1$-$C_{20}$ alkyl group;

Scheme 6

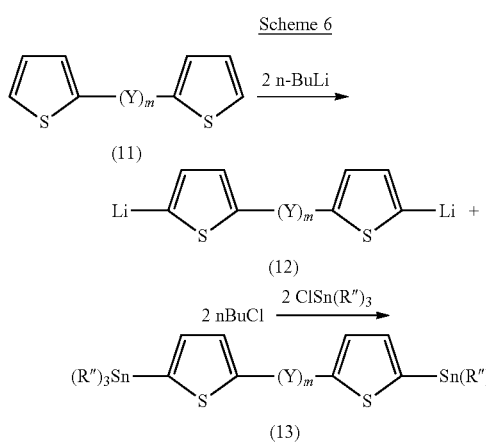

wherein Y represents a group selected from the electron-rich units (donor) indicated above in Figure 1, m is 0 or 1, and the substituents R", the same or different from each other, represent a linear or branched $C_1$-$C_{20}$ alkyl group.

The processes described above, however, can have some drawbacks.

In the case of the Stille reaction (Scheme 1), for example, the stannylated compounds used in the reaction and obtained with the processes indicated in the above schemes (Scheme 3, Scheme 4, Scheme 5 and Scheme 6), are not easy to purify with the normal laboratory techniques. Consequently low yields of stannylated compounds are obtained, as significant quantities of the same are lost during the purification. Furthermore, the processes indicated in the above schemes require the use of highly flammable and dangerous substances such as, for example, alkyl lithium compounds and perfectly anhydrous operating conditions. Furthermore, organic derivatives of tin are substances that are extremely toxic for human beings and harmful for the environment.

In the case of the Suzuki reaction (Scheme 2), instead of derivatives of tin, the corresponding boron derivatives, acids or esters, are used. Like tin derivatives, boron-derivatives are generally prepared starting from the corresponding halogen arenes (Ar'—X) by reaction with an alkyl lithium, such as, for example, n-butyl lithium (n-BuLi), to give the corresponding aryl lithium (Ar'—Li), which is reacted in situ with a boron ester, such as, for example, 2-isopropoxy-4,4,5,5-tetramethyl-1,3,2-dioxaborolane (reaction not indicated in Scheme 7), or with a tri-alkyl-borate [B(OR")$_3$], to give the corresponding diester of arylboronic acid [Ar'—B(OR")$_2$] as indicated hereunder in Scheme 7:

Scheme 7

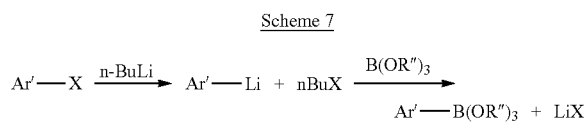

wherein Ar' represents an arene or a heteroarene, X represents a halogen atom, preferably bromine, and the substituents R", the same or different from each other, represent a linear or branched $C_1$-$C_{20}$ alkyl group, or two of the groups OR" together with the atoms to which they are bound can form a heterocyclic ring having formula (4) indicated above.

If the ester of thienyl-2-boronic acid is to be prepared, it is not necessary to use the corresponding halogen arene, i.e. 2-halogen thiophene as starting material, as the thiophene having formula (5) can be reacted directly with an alkyl lithium such as, for example, n-butyl lithium (n-BuLi), or with a lithium di-alkyl amide (reaction not indicated in Scheme 8) obtaining a thienyl-lithium having formula (6) which can be reacted in situ with a tri-alkyl borate [B(OR")$_3$], to give the corresponding diester of thienylboronic acid [Ar'—B(OR")$_2$] having formula (7a) as indicated hereunder in Scheme 8:

Scheme 8

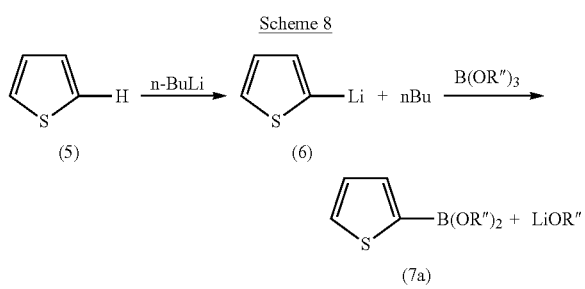

wherein the substituents R", the same or different from each other, represent a linear or branched $C_1$-$C_{20}$ alkyl group, or two of the groups OR" together with the atoms to which they are bound can form a heterocyclic ring having formula (4) indicated above.

Analogously, the esters of di-arylboronic acids having formula (3) can be prepared by reacting a di-halogen arene having formula (8) with an alkyl lithium such as, for example, n-butyl lithium (n-BuLi), obtaining a di-lithium-arene having formula (9) which can be reacted in situ with a tri-alkyl borate [B(OR")$_3$] as indicated hereunder in Scheme 9; or di-2,5-thienylboronic acids (13a) can be prepared by reacting a di-thienyl derivative having formula (11) with an alkyl lithium such as, for example, n-butyl lithium (n-BuLi), obtaining a di-lithium-bis-thienyl derivative having formula (12) which can be reacted in situ with a tri-alkyl borate [B(OR")$_3$] as indicated hereunder in Scheme 10:

Scheme 9

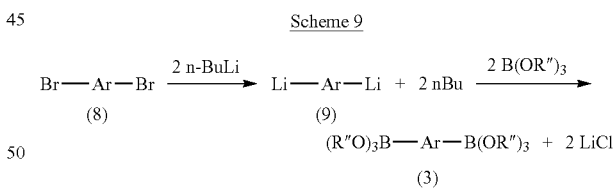

wherein Ar represents an arene or a heteroarene, and the substituents R", the same or different from each other, represent a linear or branched $C_1$-$C_{20}$ alkyl group, or the groups OR" together with the atoms to which they are bound can form a heterocyclic ring having formula (4) indicated above;

Scheme 10

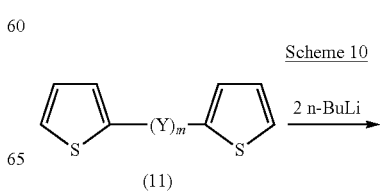

-continued

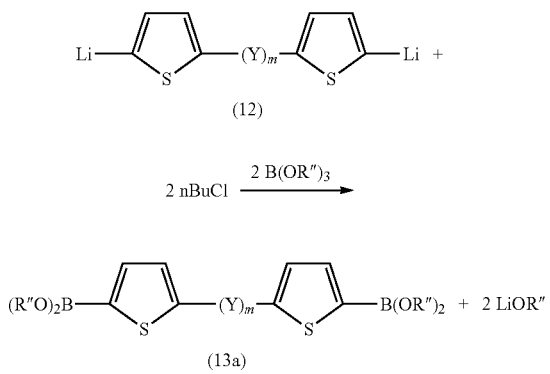

wherein Y represents a group selected from the electron-rich units (donor) indicated above in Figure 1, m is 0 or 1, and the substituents R", the same or different from each other, represent a linear or branched $C_1$-$C_{20}$ alkyl group, or two of the groups OR" together with the atoms to which they are bound can form a heterocyclic ring having formula (4) indicated above.

Boron derivatives can also have some drawbacks, however. Also in this case, their purification is not easy and is often accompanied by a partial degradation of the boron derivative.

Unlike stannylated compounds, boron esters are not substances which are toxic and harmful for the environment. Like stannylated compounds, their preparation, however, requires the use of highly flammable and dangerous substances such as alkyl lithium compounds and perfectly anhydrous operating conditions.

The Applicant has therefore considered the problem of finding a process for the production of a polymer containing benzohetero[1,3]diazole units capable of overcoming the above drawbacks. In particular, the Applicant has considered the problem of finding a process for the production of a polymer containing benzohetero[1,3]diazole units which does not require the use of stannylated or boronated compounds.

The Applicant has now found that the production of a polymer containing a benzohetero[1,3]diazole unit can be carried out by means of a process which comprises reacting at least one disubstituted benzohetero[1,3]diazole compound with at least one heteroaryl compound. Said process avoids the use of stannylated or boronated compounds with a consequent saving of times and of process costs, in addition to negative effects on the environment and/or on the health of the operators. Furthermore, said process allows a reduction in the quantity of metallic residues present in the polymer obtained, and also to obtain a tin-free polymer. Said polymer can be advantageously used in the construction of photovoltaic devices such as, for example, photovoltaic cells, photovoltaic modules, solar cells, solar modules, on both a rigid and flexible support. Furthermore, said polymer can be advantageously used in the construction of Organic Thin Film Transistors (OTFTs), or of Organic Field Effect Transistors (OFETs)

An object of the present invention therefore relates to a process for the preparation of a polymer containing benzohetero[1,3]diazole units having general formula (I), (II), (III) or (IV):

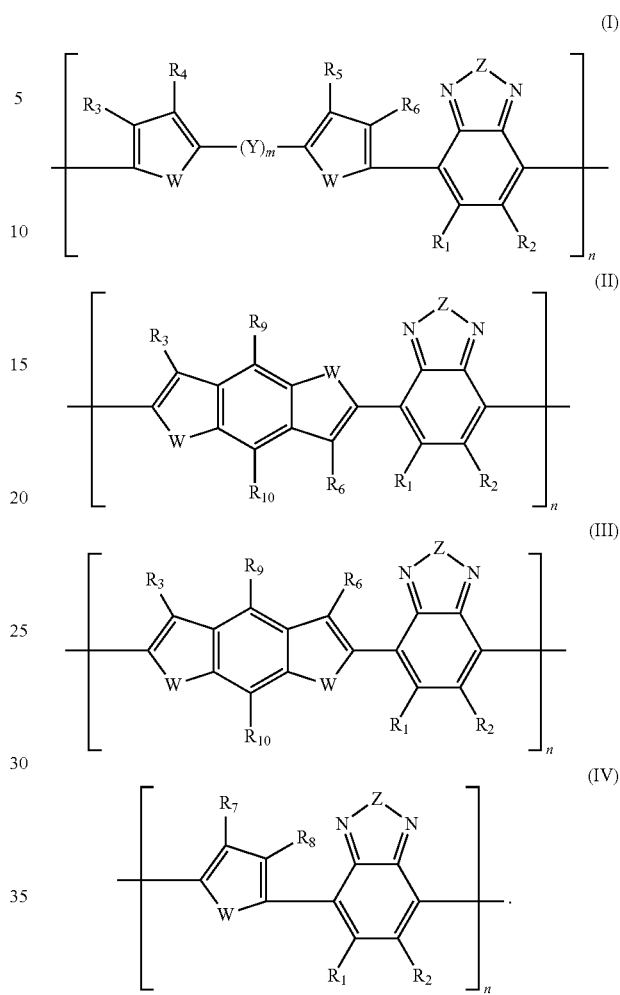

wherein:
$R_1$, $R_2$, $R_3$ and $R_6$, the same or different from each other, represent a hydrogen atom; a linear or branched $C_1$-$C_{20}$, preferably $C_2$-$C_{10}$, alkyl group; a linear or branched $C_1$-$C_{20}$, preferably $C_2$-$C_{10}$, alkoxyl group;

Y represents a penta- or hexa-atomic heteroarylene group, also benzo-condensed or heterobicyclic, containing from 1 to 4 heteroatoms selected from nitrogen, oxygen, sulfur, silicon, selenium, phosphorous such as, for example, thiophenylene, 3,4-dialkylthiophenylene, 3,4-dialkoxythiophenyl-ene, 2,7-(9,9-dialkyl)fluorenylene, 3,6-(9-alkyl)carbazolene, 2,7-(9-alkyl)carbazolene, 4,7-(2-alkyl)benzo-2,1,3-triazolene, 10-alkyl-acridolene, wherein alkyl represents a linear or branched $C_1$-$C_{20}$, preferably $C_2$-$C_{10}$, alkyl group and alkoxy represents a linear or branched $C_1$-$C_{20}$, preferably $C_2$-$C_{10}$, alkoxyl group; or Y represents an arylene group, said arylene group being optionally substituted with one or more —$CR_{11}$ groups or with one or more —$COR_{11}$ groups wherein $R_{11}$ represents a hydrogen atom, or a linear or branched $C_1$-$C_{20}$, preferably $C_2$-$C_{10}$, alkyl group, or with one or more linear or branched $C_1$-$C_{20}$, preferably $C_2$-$C_{10}$, alkyl groups, or with one or more aryl groups;

W represents an oxygen atom; a sulfur atom; an NR group wherein R represents a hydrogen atom, or a linear or branched $C_1$-$C_{20}$, preferably $C_2$-$C_{10}$, alkyl group;

Z represents a sulfur atom; an oxygen atom; a selenium atom; an NR group wherein R represents a hydrogen atom, or a linear or branched $C_1$-$C_{30}$ preferably $C_6$-$C_{26}$, alkyl group;

$R_4$ and $R_5$, the same or different from each other, represent a hydrogen atom; a linear or branched $C_1$-$C_{20}$, preferably $C_2$-$C_{10}$, alkyl group; a linear or branched $C_1$-$C_{20}$, preferably $C_2$-$C_{10}$, alkoxyl group; or, when m is 0, $R_4$ and $R_5$ can be optionally bound to each other to form, together with the carbon atoms to which they are bound, a condensed cycle containing from 3 to 14 carbon atoms, preferably from 4 to 6, carbon atoms, saturated, unsaturated, or aromatic, optionally containing one or more heteroatoms such as, for example, oxygen, sulfur, nitrogen, silicon, phosphorous, selenium, said condensed cycle being optionally substituted with one or more linear or branched $C_1$-$C_{20}$, preferably $C_2$-$C_{10}$, alkyl groups, or with one or more linear or branched $C_1$-$C_{20}$, preferably $C_2$-$C_{10}$, alkoxyl groups;

$R_7$ and $R_8$, the same or different from each other, represent a hydrogen atom; a linear or branched $C_1$-$C_{20}$, preferably $C_2$-$C_{10}$, alkyl group; a linear or branched $C_1$-$C_{20}$, preferably $C_2$-$C_{10}$, alkoxyl group; a —$CH_2OR_{12}$ group wherein $R_{12}$ represents a hydrogen atom, or a linear or branched $C_1$-$C_{20}$, preferably $C_2$-$C_{10}$, alkyl group; or, $R_7$ and $R_8$ can be optionally bound to each other to form, together with the carbon atoms to which they are bound, a condensed cycle containing from 3 to 14 carbon atoms, preferably from 4 to 6, carbon atoms, saturated, unsaturated or aromatic, optionally containing one or more heteroatoms such as, for example, oxygen, sulfur, nitrogen, silicon, phosphorous, selenium, said condensed cycle being optionally substituted with one or more linear or branched $C_1$-$C_{20}$, preferably $C_2$-$C_{10}$, alkyl groups, or with one or more linear or branched $C_1$-$C_{20}$, preferably $C_2$-$C_{10}$, alkoxyl groups;

$R_9$ and $R_{10}$, the same or different from each other, represent a hydrogen atom; a linear or branched $C_1$-$C_{20}$, preferably $C_2$-$C_{10}$ alkyl group; a linear or branched $C_1$-$C_{20}$, preferably $C_2$-$C_{10}$, alkoxyl group;

m is 0, 1, or 2;

n is an integer ranging from 10 to 500, preferably from 20 to 300;

said process comprising reacting at least one disubstituted benzohetero[1,3]diazole compound having general formula (V):

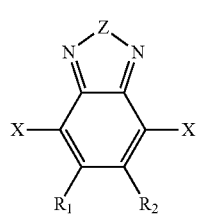

(V)

wherein X represents a halogen atom selected from chlorine, fluorine, bromine, iodine, preferably bromine, and Z, $R_1$ and $R_2$, have the same meanings described above;

with at least one heteroaryl compound having general formula (VI), (VII), (VIII) or (IX):

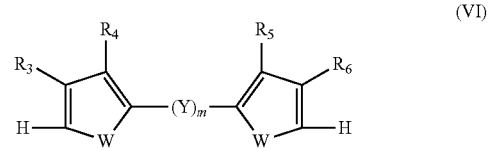

(VI)

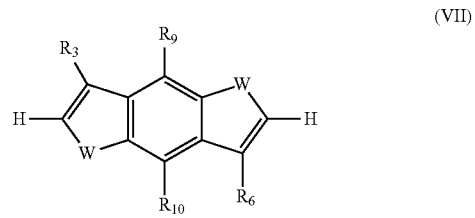

(VII)

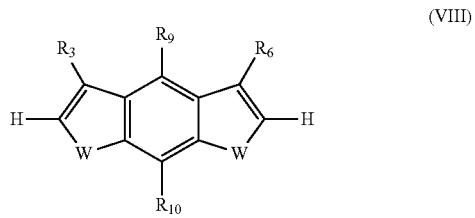

(VIII)

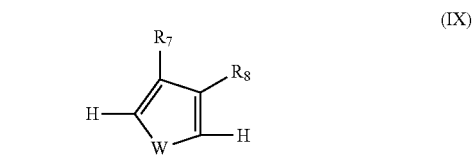

(IX)

wherein W, Y, $R_3$, $R_4$, $R_5$, $R_6$, $R_7$, $R_8$, $R_9$ and $R_{10}$, have the same meanings described above For the purposes of the present description and of the following claims, the definitions of the numerical ranges always comprise the extremes unless otherwise specified.

The term "$C_1$-$C_{20}$ alkyl group" refers to a linear or branched alkyl group having from 1 to 20 carbon atoms. Specific examples of a $C_1$-$C_{20}$ alkyl group are: methyl, ethyl, n-propyl, iso-propyl, n-butyl, iso-butyl, t-butyl, pentyl, ethylhexyl, hexyl, heptyl, octyl, n-nonyl, decyl, dodecyl.

The term "aryl group" refers to an aromatic carbocyclic group. Said aromatic carbocyclic group can be optionally substituted with one or more groups, the same or different from each other, selected from: halogen atoms such as, for example, fluorine, chlorine, preferably fluorine; hydroxyl groups; $C_1$-$C_{20}$ alkyl groups; $C_1$-$C_{20}$ alkoxyl groups, cyano groups; amino groups; nitro groups. Specific examples of an aryl group are: phenyl, methylphenyl, trimethylphenyl, methoxyphenyl, hydroxyphenyl, phenyloxyphenyl, fluorophenyl, pentafluorophenyl, chlorophenyl, nitrophenyl, dimethylaminophenyl, naphthyl, phenylnaphthyl, phenanthrene, anthracene.

The term "$C_1$-$C_{20}$ alkoxyl group" refers to a linear or branched alkoxyl group having from 1 to 20 carbon atoms. Specific examples of a $C_1$-$C_{20}$ alkoxyl group are: methoxyl, ethoxyl, n-propoxyl, iso-propoxyl, n-butoxyl, iso-butoxyl, tert-butoxyl, pentoxyl, hexyloxyl, heptyloxyl, octyloxyl, nonyloxyl, decyloxyl, dodecyloxyl.

The term "arylene groups" refers to divalent aromatic carbocyclic groups. Said aromatic carbocyclic groups can be optionally substituted with one or more groups selected from those indicated above, or with one or more groups, the same or different from each other, selected from: halogen atoms such as, for example, fluorine, chlorine, preferably fluorine; hydroxyl groups; $C_1$-$C_{20}$ alkoxyl groups, cyano groups; amino groups; nitro groups. Specific examples of arylene groups are: phenylene, methylphenylene, trimethylphenylene, methoxyphenylene, hydroxyphenylene, phenyloxyphenylene, fluorophenylene, pentafluoro-phenylene, chlorophenylene, nitrophenylene, dimethyl-aminophenylene, naphthylene, phenylnaphthylene, phenanthrenylene, anthracenylene.

The term "condensed cycle containing from 3 to 14 carbon atoms" refers to a system containing one or more rings containing from 3 to 14 carbon atoms. Specific examples of a condensed cycle containing from 3 to 14 carbon atoms are: benzothiadiazole, benzooxadiazole, pyridothiadiazole, quinoxaline, thienopyrazine, pyridopyrazine, dithienopyrrole, diketo pyrrole-pyrrole, thienothiophene, benzodithiophene, cyclopenta-dithiophene, silylcyclopentadiene, naphthalenediimide, perylenediimide, carbazole, fluorene.

According to a preferred embodiment of the present invention, said polymer having general formula (I), (II), (III) or (IV), can have a weight average molecular weight (Mw) ranging from 3,000 Dalton to 300,000 Dalton, preferably ranging from 6,000 Dalton to 200,000 Dalton. Said weight average molecular weight (Mw) can be determined as indicated hereunder.

The above process can be carried out according to Scheme 11, Scheme 12, Scheme 13 or Scheme 14 indicated hereunder.

Scheme 11

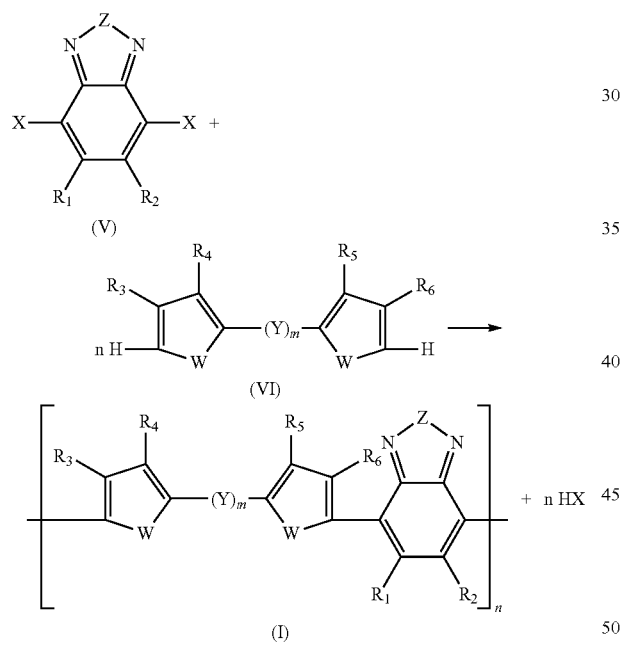

wherein X, Z, W, $R_1$, $R_2$, $R_3$, $R_4$, $R_5$, $R_6$, $R_7$, $R_8$, m and n, have the same meanings described above.

Scheme 12

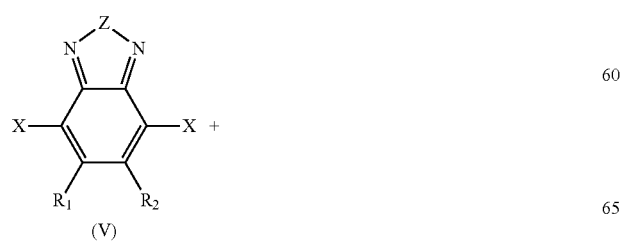 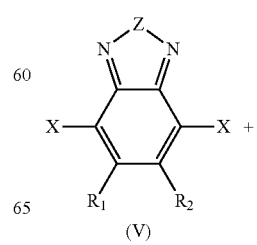

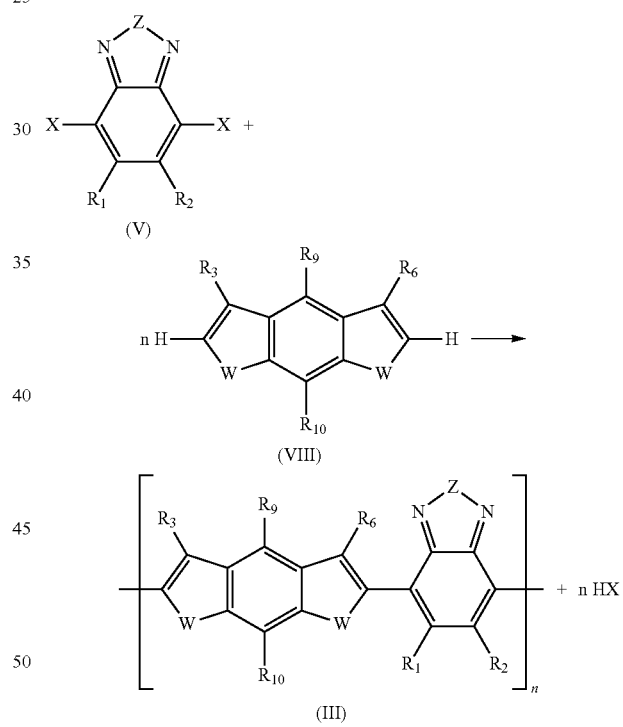

wherein X, Z, W, $R_1$, $R_2$, $R_3$, $R_6$, $R_9$ and $R_{10}$, have the same meanings described above.

Scheme 13

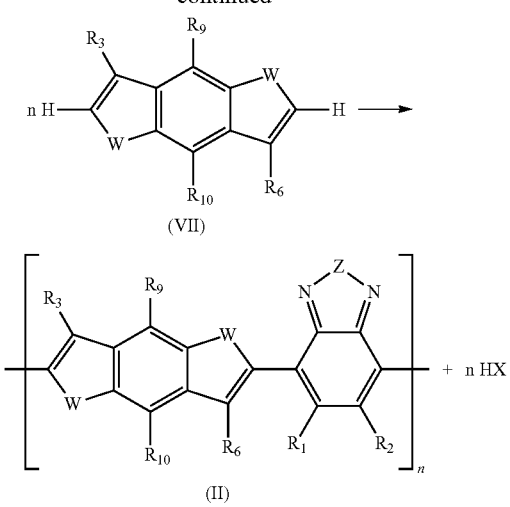

wherein X, Z, W, $R_1$, $R_2$, $R_3$, $R_6$, $R_9$ and $R_{10}$, have the same meanings described above.

Scheme 14

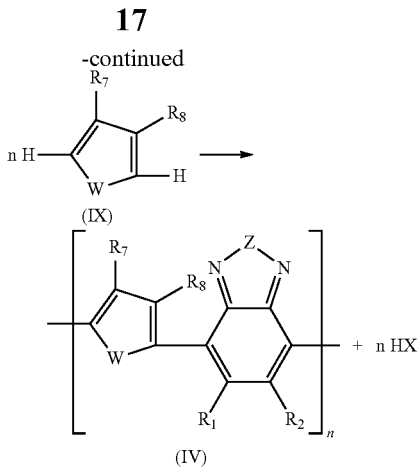

wherein X, Z, W, R₁, R₂, R₃, R₄, R₅, R₆, R₇, R₈, m and n, have the same meanings described above.

For the purpose of the present invention, the disubstituted benzohetero[1,3]diazole compound having general formula (V) and the heteroaryl compound having general formula (VI), (VII), (VIII) or (IX), can be used in molar ratios which vary according to the reaction stoichiometry, for example in a molar ratio 1:1.

According to a preferred embodiment of the present invention, said process can be carried out in the presence of a weak organic base.

According to a preferred embodiment of the present invention, said weak organic base can be selected, for example, from: carboxylates of alkaline metals (e.g., sodium, potassium, caesium) or of alkaline-earth metals (e.g., magnesium, calcium) such as, for example, potassium acetate, sodium acetate, caesium acetate, magnesium acetate, calcium acetate, potassium propionate, sodium propionate, caesium propionate, magnesium propionate, calcium propionate, or mixtures thereof; carbonates of alkaline metals (e.g., lithium, sodium, potassium, caesium) or of alkaline-earth metals (e.g., magnesium, calcium) such as, for example, lithium carbonate, potassium carbonate, sodium carbonate, caesium carbonate, magnesium carbonate, calcium carbonate, or mixtures thereof; bicarbonates of alkaline metals (e.g., lithium, sodium, potassium, caesium) or of alkaline-earth metals (e.g., magnesium, calcium) such as, for example, lithium bicarbonate, potassium bicarbonate, sodium bicarbonate, caesium bicarbonate, magnesium bicarbonate, calcium bicarbonate, or mixtures thereof; or mixtures thereof. Said weak organic base is preferably potassium acetate.

According to a preferred embodiment of the present invention, said disubstituted benzohetero[1,3]diazole compound having general formula (V) and said weak organic base can be used in molar ratios ranging from 1:3 to 1:5, preferably ranging from 1:2.5 to 1:4.

According to a preferred embodiment of the present invention, said process can be carried out in the presence of at least one catalyst containing palladium.

According to a preferred embodiment of the present invention, said catalyst containing palladium can be selected from palladium compounds in oxidation state (0) or (II) such as, for example: palladium(II)chloride [PdCl₂], palladium(II)acetate [Pd(OAc)₂], bis(dibenzylidene)palladium(0) [Pd(dba)₂ wherein dba=C₆H₅CH═CHCOCH═CHC₆H₅], bis(acetonitrile)palladium(II) chloride [Pd(CH₃CN)₂Cl₂], or mixtures thereof. Said catalyst containing palladium is preferably palladium(II)acetate [Pd(OAc)₂].

According to a preferred embodiment of the present invention, said heteroaryl compound having general formula (VI), (VII), (VIII) or (IX), and said catalyst containing palladium can be used in molar ratios ranging from 100:0.1 to 100:3, preferably ranging from 100:0.4 to 100:2.

According to a preferred embodiment of the present invention, said disubstituted benzohetero[1,3]diazole compound having general formula (V) can be used at a concentration ranging from 0.01 M to 2 M, preferably ranging from 0.02 M to 1 M.

According to a preferred embodiment of the present invention, said process can be carried out in the presence of at least one solvent selected from dipolar aprotic organic solvents, halogenated aromatic solvents, or mixtures thereof.

According to a preferred embodiment of the present invention, said solvent can be selected from: N,N-dimethylacetamide (DMAc), dimethylsulfoxide (DMSO), N-methylpyrrolidone (NMP), dimethylformamide (DMF), chlorobenzene, dichlorobenzene, chloronaphthalene, dichloronaphthalene, or mixtures thereof. Said solvent is preferably selected from: N,N-dimethylacetamide (DMAc), chlorobenzene, or mixtures thereof.

According to a preferred embodiment of the present invention, said process can be carried out at a temperature ranging from 80° C. to 170° C., preferably ranging from 100° C. to 150° C.

According to a preferred embodiment of the present invention, said process can be carried out for a time ranging from 12 hours to 96 hours, preferably ranging from 24 hours to 72 hours.

The disubstituted benzohetero[1,3]diazole compound having general formula (V) can be obtained according to processes known in the art, for example, by halogenation of the corresponding benzohetero[1,3]diazole compounds. Further details relating to said processes can be found, for example, in international patent application WO 2007/081991, or in "Journal of Heterocyclic Chemistry" (1970), Vol. 7, Issue 3, pages 629-633, in the article of Pilgram et al.

The heteroaryl compound having general formula (VI), (VII), (VIII) or (IX), can be easily found on the market.

Some illustrative and non-limiting examples are provided for a better understanding of the present invention and for its practical embodiment.

Characterization of the Monomers and of the Polymers Obtained

Determination of the Molecular Weight

The molecular weight of the polymers obtained operating in accordance with the following examples, was determined by means of Gel Permeation Chromatography" (GPC) on a WATERS 150C instrument, using HT5432 columns, with trichlorobenzene as eluent, at 80° C.

The weight average molecular weight (Mw), the number average molecular weight (Mn) and the polydispersion index (PDI), corresponding to the Mw/Mn ratio, are reported.

EXAMPLE 1

Preparation of the Polymer Having Formula (a)

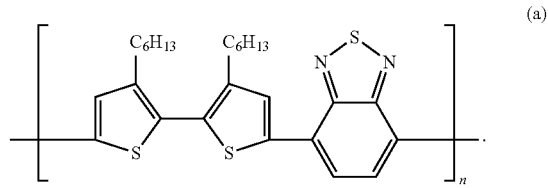

4,7-dibromo-2,1,3-benzothiadiazole (0.294 g, 1.0 mmole), potassium acetate (0.295 g, 3.0 mmoles), N,N-dimethylacetamide (5 ml), 3,3'-dihexyl-2,2'-dithiophene (0.335 g, 1 mmole) and palladium (II)acetate [Pd(OAc)₂] (1.2 mg, 0.005 mmoles), were charged into a 30 ml Pyrex glass reactor equipped with a screw stopper.

The reactor was placed in an oil bath preheated to 130° C. and left under vigorous stirring for 72 hours. The colour of the reaction mixture became blood-red in about 20 minutes and subsequently dark purple at the end of the reaction (i.e. after 72 hours). After cooling to room temperature (25° C.), the reaction mixture was put in methanol (300 ml) and the precipitate obtained was washed with a mixture of n-heptane (100 ml) and ethyl ether (100 ml). The residue obtained (brown solid) was dissolved in chlorobenzene (5 ml) and re-precipitated in methanol (300 ml). The polymer obtained was dried under vacuum at 50° C., for 16 hours, obtaining 0.416 g of a dark purple solid (yield 89%).

Said polymer was subjected to molecular weight determination by means of Gel Permeation Chromatography" (GPC), operating as described above, obtaining the following results:
(Mw)=22520 Dalton;
(Mn)=7765 Dalton;
(PDI)=2.90.

EXAMPLE 2

Preparation of the Polymer Having Formula (a)

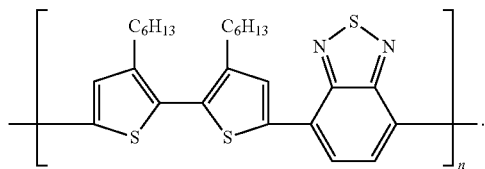

4,7-dibromo-2,1,3-benzothiadiazole (0.294 g, 1.0 mmole), potassium acetate (0.295 g, 3.0 mmoles), 15 ml of a mixture of N,N-dimethylacetamide (13.5 ml) and chlorobenzene (1.5 ml), 3,3'-dihexyl-2,2'-dithiophene (0.335 g, 1 mmole) and palladium(II)acetate [Pd(OAc)₂] (1.2 mg, 0.005 mmoles), were charged into a 30 ml Pyrex glass reactor equipped with a screw stopper.

The reactor was placed in an oil bath preheated to 130° C. and left under vigorous stirring for 72 hours. The colour of the reaction mixture became blood-red in about 20 minutes and subsequently dark purple at the end of the reaction (i.e. after 72 hours). After cooling to room temperature (25° C.), the reaction mixture was put in methanol (300 ml) and the precipitate obtained was washed with a mixture of n-heptane (100 ml) and ethyl ether (100 ml). The residue obtained (brown solid) was dissolved in chlorobenzene (5 ml) and re-precipitated in methanol (300 ml). The polymer obtained was dried under vacuum at 50° C., for 16 hours, obtaining 0.416 g of a dark purple solid (yield 89%).

Said polymer was subjected to molecular weight determination by means of Gel Permeation Chromatography" (GPC), operating as described above, obtaining the following results:
(Mw)=34284 Dalton;
(Mn)=10179 Dalton;
(PDI)=3.368.

EXAMPLE 3

Preparation of the Polymer Having Formula (b)

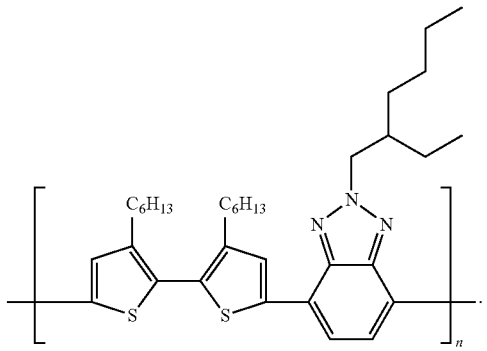

4,7-dibromo-2,1,3-benzothiadiazole (0.389 g, 1.0 mmole), potassium acetate (0.295 g, 3.0 mmoles), 15 ml of a mixture of N,N-dimethylacetamide (13.5 ml) and chlorobenzene (1.5 ml), 3,3'-dihexyl-2,2'-dithiophene (0.335 g, 1 mmole) and palladium(II)acetate [Pd(OAc)₂] (1.2 mg, 0.005 mmoles), were charged into a 30 ml Pyrex glass reactor equipped with a screw stopper.

The reactor was placed in an oil bath preheated to 130° C. and left under vigorous stirring for 72 hours. The colour of the reaction mixture became an orange-red colour in about 20 minutes and subsequently dark orange at the end of the reaction (i.e. after 72 hours). After cooling to room temperature (25° C.), the reaction mixture was put in methanol (300 ml) and the precipitate obtained was washed with a mixture of n-heptane (100 ml) and ethyl ether (100 ml). The residue obtained (brown solid) was dissolved in chlorobenzene (5 ml) and re-precipitated in methanol (300 ml). The polymer obtained was dried under vacuum at 50° C., for 16 hours, obtaining 0.551 g of a dark orange solid (yield 98%).

Said polymer was subjected to molecular weight determination by means of Gel Permeation Chromatography" (GPC), operating as described above, obtaining the following results:
(Mw)=59802 Dalton;
(Mn)=12885 Dalton;
(PDI)=4.64.

EXAMPLE 4

Preparation of the Polymer Having Formula (c)

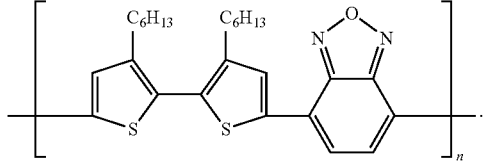

4,7-dibromo-2,1,3-benzooxadiazole (0.278 g, 1.0 mmole), potassium acetate (0.295 g, 3.0 mmoles), 15 ml of a mixture of N,N-dimethylacetamide (12 ml) and chlorobenzene (3 ml), 3,3'-dihexyl-2,2'-dithiophene (0.335 g, 1 mmole) and palladium(II)acetate [Pd(OAc)₂] (1.2 mg, 0.005 mmoles), were charged into a 30 ml Pyrex glass reactor equipped with a screw stopper.

The reactor was placed in an oil bath preheated to 130° C. and left under vigorous stirring for 72 hours. The colour of the reaction mixture became blood-red in about 20 minutes and subsequently dark red at the end of the reaction (i.e. after 72 hours). After cooling to room temperature (25° C.), the reaction mixture was put in methanol (300 ml) and the precipitate obtained was washed with a mixture of n-heptane (100 ml) and ethyl ether (100 ml). The residue obtained (brown solid) was dissolved in chlorobenzene (5 ml) and re-precipitated in methanol (300 ml). The polymer obtained was dried under vacuum at 50° C., for 16 hours, obtaining 0.393 g of a dark purple solid (yield 87%).

Said polymer was subjected to molecular weight determination by means of Gel Permeation Chromatography" (GPC), operating as described above, obtaining the following results:

(Mw)=14579 Dalton;
(Mn)=8465 Dalton;
(PDI)=1.72.

The invention claimed is:

1. A process for the preparation of a polymer containing benzohetero[1,3]diazole units having general formula (I), (II), (III) or (IV):

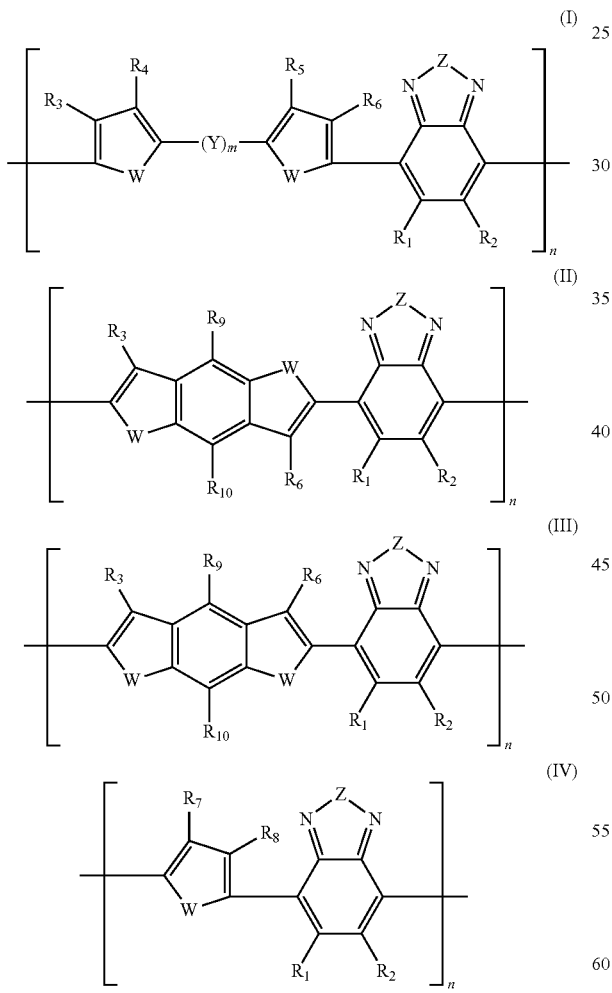

wherein:

$R_1$, $R_2$, $R_3$ and $R_6$, the same or different from each other, represent a hydrogen atom; a linear or branched $C_1$-$C_{20}$ alkyl group; a linear or branched $C_1$-$C_{20}$ alkoxyl group;

Y represents a penta- or hexa-atomic heteroarylene group, also benzo-condensed or heterobicyclic, containing from 1 to 4 heteroatoms selected from nitrogen, oxygen, sulfur, silicon, selenium, phosphorous; or Y represents an arylene group, said arylene group being optionally substituted with one or more —CR— groups or with one or more —COR— groups wherein $R_{11}$ represents a hydrogen atom or a linear or branched $C_1$-$C_{20}$ alkyl group, or with one or more linear or branched $C_1$-$C_{20}$ alkyl groups, or with one or more aryl groups;

W represents an oxygen atom; a sulfur atom; an NR group wherein R represents a hydrogen atom, or a linear or branched $C_1$-$C_{20}$ alkyl group;

Z represents a sulfur atom; an oxygen atom; a selenium atom; an NR group wherein R represents a hydrogen atom, or a linear or branched $C_1$-$C_{30}$ alkyl group;

$R_4$ and $R_5$, the same or different from each other, represent a hydrogen atoms; a linear or branched $C_1$-$C_{20}$ alkyl group; a linear or branched $C_1$-$C_{20}$ alkoxyl group; or, when m is 0, $R_4$ and $R_5$ can be optionally bound to each other to form, together with the carbon atoms to which they are bound, a condensed cycle containing from 3 to 14 carbon atoms, saturated, unsaturated, or aromatic, optionally containing one or more heteroatoms, said condensed cycle being optionally substituted with one or more linear or branched $C_1$-$C_{20}$ alkyl groups, or with one or more linear or branched $C_1$-$C_{20}$ alkoxyl groups;

$R_7$ and $R_8$, the same or different from each other, represent a hydrogen atom; a linear or branched $C_1$-$C_{20}$ alkyl group; a linear or branched $C_1$-$C_{20}$ alkoxyl group; a —$CH_2OR_{12}$ group wherein $R_{12}$ represents a hydrogen atom, or a linear or branched $C_1$-$C_{20}$ alkyl group; or, $R_7$ and $R_8$ can be optionally bound to each other to form, together with the carbon atoms to which they are bound, a condensed cycle containing from 3 to 14 saturated, unsaturated or aromatic carbon atoms, optionally containing one or more heteroatoms, said condensed cycle being optionally substituted with one or more linear or branched $C_1$-$C_{20}$ alkyl groups, or with one or more linear or branched $C_1$-$C_{20}$ alkoxyl groups;

$R_9$ and $R_{10}$, the same or different from each other, represent a hydrogen atom; a linear or branched $C_1$-$C_{20}$ alkyl group; a linear or branched $C_1$-$C_{20}$ alkoxyl group;

m is 0, 1, or 2;

n is an integer ranging from 10 to 500;

said process comprising:

reacting at least one disubstituted benzohetero[1,3]diazole compound having general formula (V):

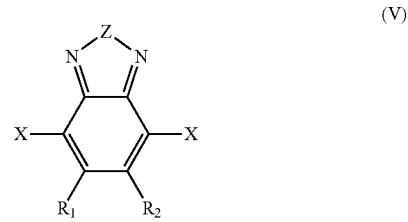

wherein X represents a halogen atom selected from chlorine, fluorine, bromine, iodine, and Z, $R_1$ and $R_2$, have the same meanings described above;

with at least one heteroaryl compound having general formula (VI), (VII), (VIII) or (IX):

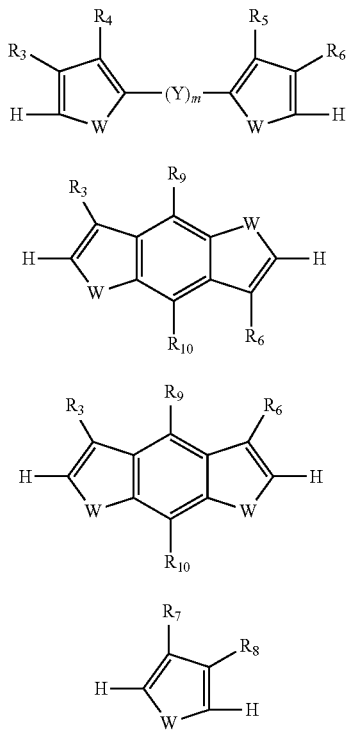

wherein W, Y, $R_3$, $R_4$, $R_5$, $R_6$, $R_7$, $R_8$, $R_9$ and $R_{10}$, have the same meanings described above.

2. The process according to claim 1, wherein said polymer having general formula (I), (II), (III) or (IV), has a weight average molecular weight (Mw) ranging from 3,000 Dalton to 300,000 Dalton.

3. The process according to claim 2, wherein said polymer having general formula (I), (II), (III) or (IV), has a weight average molecular weight (Mw) ranging from 6,000 Dalton to 200,000 Dalton.

4. The process according to claim 1, wherein said process is carried out in the presence of a weak organic base.

5. The process according to claim 4, wherein said weak organic base is selected from: carboxylates of alkaline or of alkaline-earth metals; carbonates of alkaline or of alkaline-earth metals; bicarbonates of alkaline or of alkaline-earth metals; or mixtures thereof.

6. The process according to claim 5, wherein said weak organic base is potassium acetate.

7. The process according to claim 1, wherein said disubstituted benzohetero[1,3]diazole compound having general formula (V) and said weak organic base are used in molar ratios ranging from 1:3 to 1:5.

8. The process according to claim 7, wherein said disubstituted benzohetero[1,3]diazole compound having general formula (V) and said weak organic base are used in molar ratios ranging from 1:2.5 to 1:4.

9. The process according to claim 1, wherein said process is carried out in the presence of at least one catalyst containing palladium.

10. The process according to claim 9, wherein said catalyst containing palladium is selected from palladium compounds in oxidation state (0) or (II), or mixtures thereof.

11. The process according to claim 10, wherein said catalyst containing palladium is palladium(II)acetate [Pd(OAc)$_2$].

12. The process according to, wherein said heteroaryl compound having general formula (VI), (VII), (VIII) or (IX), and said catalyst containing palladium are used in molar ratios ranging from 100:0.1 to 100:3.

13. The process according to claim 12, wherein said heteroaryl compound having general formula (VI), (VII), (VIII) or (IX), and said catalyst containing palladium are used in molar ratios ranging from 100:0.4 to 100:2.

14. The process according to claim 1, wherein said disubstituted benzohetero[1,3]diazole compound having general formula (V) is used at a concentration ranging from 0.01 M to 2 M.

15. The process according to claim 14, wherein said disubstituted benzohetero[1,3]diazole compound having general formula (V) is used at a concentration ranging from 0.02 M to 1 M.

16. The process according to claim 1, wherein said process is carried out in the presence of at least one solvent selected from dipolar aprotic organic solvents, halogenated aromatic solvents, or mixtures thereof.

17. The process according to claim 16, wherein said solvent is selected from: N,N-dimethylacetamide (DMAc), dimethylsulfoxide (DMSO), N-methylpyrrolidone (NMP), dimethylformamide (DMF), chlorobenzene, dichlorobenzene, chloronaphthalene, dichloronaphthalene, or mixtures thereof.

18. The process according to claim 17, wherein said solvent is selected from: N,N-dimethylacetamide (DMAc), chlorobenzene, or mixtures thereof.

19. The process according to claim 1, wherein said process is carried out at a temperature ranging from 80° C. to 170° C.

20. The process according to claim 19, wherein said process is carried out at a temperature ranging from 100° C. to 150° C.

21. The process according to claim 1, wherein said process is carried out for a time ranging from 12 hours to 96 hours.

22. The process according to claim 21, wherein said process is carried out for a time ranging from 24 hours to 72 hours.

* * * * *

UNITED STATES PATENT AND TRADEMARK OFFICE
CERTIFICATE OF CORRECTION

PATENT NO.        : 9,150,696 B2
APPLICATION NO.   : 14/237528
DATED             : October 6, 2015
INVENTOR(S)       : Giuliana Schimperna et al.

Page 1 of 1

It is certified that error appears in the above-identified patent and that said Letters Patent is hereby corrected as shown below:

Claims

Column 22, Line 7 claim 1, "-CR-- groups or with one or more –COR--groups" should read --$CR_{11}$ groups or with one or more-$COR_{11}$ groups--

Column 24, Line 16 claim 12, "according to, wherein" should read --according to claim 1, wherein--

Signed and Sealed this
Twenty-third Day of February, 2016

Michelle K. Lee
*Director of the United States Patent and Trademark Office*